United States Patent
Toyoda et al.

(10) Patent No.: US 8,354,045 B2
(45) Date of Patent: Jan. 15, 2013

(54) INK COMPOSITION AND PATTERN FORMING METHOD

(75) Inventors: Naoyuki Toyoda, Suwa (JP); Toshiaki Mikoshiba, Suwa (JP)

(73) Assignee: Seiko Epson Corporation (JP)

( * ) Notice: Subject to any disclaimer, the term of this patent is extended or adjusted under 35 U.S.C. 154(b) by 253 days.

(21) Appl. No.: 12/939,544

(22) Filed: Nov. 4, 2010

(65) Prior Publication Data

US 2011/0050786 A1 Mar. 3, 2011

Related U.S. Application Data

(62) Division of application No. 11/935,435, filed on Nov. 6, 2007, now Pat. No. 7,850,875.

(30) Foreign Application Priority Data

Nov. 9, 2006 (JP) .................................. 2006-303657

(51) Int. Cl.
- *H01B 1/02* (2006.01)
- *H01B 1/22* (2006.01)
- *H01L 29/08* (2006.01)

(52) U.S. Cl. ........................... 252/513; 252/514; 257/40

(58) Field of Classification Search .................. 252/513, 252/514; 257/40

See application file for complete search history.

(56) References Cited

U.S. PATENT DOCUMENTS

| | | | |
|---|---|---|---|
| 6,123,876 | A | 9/2000 | Kobayashi et al. |
| 7,234,805 | B2 | 6/2007 | Maekawa et al. |
| 7,445,731 | B2 | 11/2008 | Okada et al. |
| 7,560,052 | B2 | 7/2009 | Enciu et al. |
| 7,608,203 | B2 | 10/2009 | Okada et al. |
| 2005/0189520 | A1 | 9/2005 | Okada et al. |
| 2007/0290175 | A1 | 12/2007 | Kim |

FOREIGN PATENT DOCUMENTS

| | | |
|---|---|---|
| JP | 11-323181 | 11/1999 |
| JP | 2003-318542 | 11/2003 |
| JP | 2004-143325 | 5/2004 |
| JP | 2004-277627 | 10/2004 |
| JP | 2005-57139 | 3/2005 |
| WO | 2006072959 A1 | 7/2006 |

*Primary Examiner* — Mark Kopec
*Assistant Examiner* — Jaison Thomas
(74) *Attorney, Agent, or Firm* — Harness, Dickey & Pierce, P.L.C.

(57) ABSTRACT

An ink composition includes a metal microparticle, a dispersion medium having water as a main ingredient, a dispersant for dispersing the metal microparticle into the dispersion medium, and a water-soluble polyhydric alcohol that is trivalent to hexavalent and solid under normal conditions, and whose concentration is 5 to 20 weight % relative to a total weight of the ink composition.

2 Claims, 1 Drawing Sheet

INK COMPOSITION AND PATTERN FORMING METHOD

CROSS-REFERENCE TO RELATED APPLICATIONS

This is a divisional application of U.S. Ser. No. 11/935,435 filed Nov. 6, 2007 which claims priority to Japanese Patent Application No. 2006-303657 filed Nov. 9, 2006, all of which are incorporated by reference herein in their entirety.

TECHNICAL FIELD

The present invention relates to an ink composition and a pattern forming method.

RELATED ART

Among ceramic multiplayer substrate is one using low temperature co-fired ceramics (LTCC). Such an LTCC multilayer substrate is manufactured by laminating LTCC substrates (hereafter simply referred to as "green sheets") that is yet to be fired and then co-firing these substrates. Since the firing temperature for such an LTCC multilayer substrate may be a low temperature, laminated green sheets and metal patterns drawn on the green sheets can be fired simultaneously. As a result, a ceramic multilayer substrate using LTCC allows substantial improvement of productivity.

A method of manufacturing an LTCC multilayer substrate includes drawing metal patterns on green sheets. As a technique for performing such a drawing step, there has been proposed the inkjet technique that make metal ink into minute droplets and eject such droplets (for example, see JP-A-2003-318542 and JP-A-2005-57139). In the inkjet technique, multiple droplets are ejected on a green sheet and a metal pattern is drawn by combining such droplets. Thus, the inkjet technique enables miniaturization of the metal patterns by only changing the ejection amount and ejection position of droplets.

Incidentally, in the inkjet technique, metal ink is stored in a nozzle and droplets are ejected by vibrating the gas-liquid interface (meniscus) in the nozzle. Since the dispersion medium included in the metal ink always evaporates, metal microparticles are deposited in the proximity of the meniscus, raising the possibility of an ejection failure of the droplets. Also, the inkjet technique controls the ejection position and size of the droplets to control the shape of a pattern. Since droplets that have landed on a green sheet spread thereon in a wet state with the lapse of time, combined droplets flow out of a given area if it takes a long time for the dispersion media in the metal ink to evaporate. This raises the possibility of a remarkable reduction in shape accuracy of the pattern.

To solve these problems, there has been proposed metal ink that prevents its drying in a nozzle as well as facilitates its drying on a green sheet. According to JP-A-2004-143325, a dispersion medium included in metal ink includes water and an alcohol compound. An alcohol included in such an alcohol compound prevents evaporation of the dispersion medium before drawing so as to facilitate stable ejection of the ink. Also, the alcohol rapidly evaporates along with the dispersion medium after drawing so as to prevent droplets from flowing out.

However, as a metal pattern is further miniaturized, the time of non-use of each nozzle is increased when forming such a metal pattern, thereby increasing the evaporation amount of the dispersion medium stored in each nozzle. As a result, the alcohol compound disclosed in JP-A-2004-143325 cannot fully prevent the water from evaporating, thereby making it difficult to eject the metal ink stably. Further, any of the alcohol compounds disclosed in JP-A-2004-143325 is in a liquid phase on a green sheet that is at ambient temperature. As a result, the alcohol does not evaporate even if the water evaporates, thereby failing to fully prevent droplets from flowing out. This makes it difficult for such an alcohol compound to correspond to miniaturization of a metal pattern.

SUMMARY

An advantage of the invention is to provide an ink composition that prevents drying in a nozzle and facilitates drying on a target, and a pattern forming method.

According to a first aspect of the invention, an ink composition includes a metal microparticle, a dispersion medium having water as a main ingredient, a dispersant for dispersing the metal microparticle into the dispersion medium, and a water-soluble polyhydric alcohol that is trivalent to hexavalent and solid under normal conditions, and whose concentration is 5 to 20 weight % relative to a total weight of the ink composition.

In the first aspect of the invention, the polyhydric alcohol prevents evaporation of the dispersion medium in the ink composition by interacting with water (e.g., hydrogen bonding or van der Waals bonding). The polyhydric alcohol also facilitates the re-dispersion of the metal microparticle once deposited, by interacting with the metal microparticle (e.g., coordinate bonding). Further, since the polyhydric alcohol is solid under normal conditions, it is rapidly deposited as the dispersion medium evaporates. Thus, the ink composition loses its fluidity, thereby avoiding flowing out. Further, setting the concentration of the polyhydric alcohol to 5 to 20 weight % prevents clogging of the ejection nozzles, as well as avoids flowing-out of the droplets.

In the ink composition according to the first aspect of the invention, the polyhydric alcohol may be a sugar alcohol.

In the ink composition according to the first aspect of the invention, the sugar alcohol may be xylitol.

In the ink composition according to the first aspect of the invention, the dispersant is mercapto acid.

In the ink composition according to the first aspect of the invention, the dispersant is hydroxy acid.

In the ink composition according to the first aspect of the invention, the metal microparticle is any one of a gold microparticle, a silver microparticle, a copper microparticle, and a nickel microparticle.

According to a second aspect of the invention, a pattern forming method includes forming a metal pattern by ejecting a droplet of the ink composition according to the first aspect of the invention from an ejection nozzle toward a target.

In the pattern forming method according to the second aspect of the invention, the polyhydric alcohol prevents evaporation of the dispersion medium in the ink composition by interacting with water (e.g., hydrogen bonding or van der Waals bonding). The polyhydric alcohol also facilitates the re-dispersion of the metal microparticle once deposited, by interacting with the metal microparticle (e.g., coordinate bonding). Further, since the polyhydric alcohol is solid under normal conditions, it is rapidly deposited as the dispersion medium evaporates. Thus, the ink composition loses its fluidity, thereby avoiding flowing out. Further, setting the concentration of the polyhydric alcohol to 5 to 20 weight % prevents clogging of the ejection nozzles, as well as avoids flowing out of the droplets.

In the pattern forming method according to the second aspect of the invention, the target may previously be heated up to a predetermined temperature before the droplet is ejected.

In the pattern forming method according to the second aspect of the invention, flowing out of the droplets is avoided more reliably in proportion to the extent to which the target is heated up.

BRIEF DESCRIPTION OF THE DRAWINGS

The invention will be described with reference to the accompanying drawings, wherein like numbers reference like elements.

DESCRIPTION OF EXEMPLARY EMBODIMENTS

Ink Composition

Figure 1:
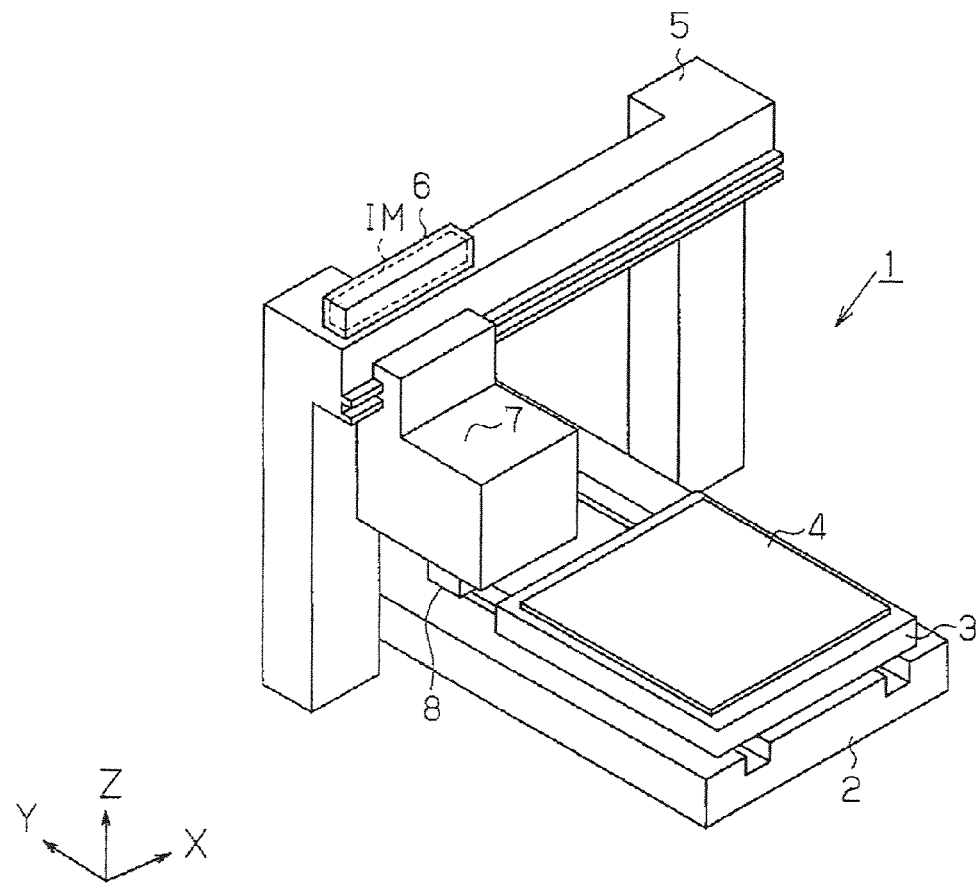
FIG. 1 is an overall perspective view of a droplet ejection device.

An ink composition according to the invention will now be described. The ink composition includes metal microparticles, a dispersion medium having water as the main ingredient, a dispersant for dispersing metal microparticles into the dispersion medium, and a water-soluble polyhydric alcohol.

Such metal microparticles may be made of a metal such as gold, silver, copper, platinum, palladium, rhodium, osmium, ruthenium, iridium, iron, tin, cobalt, nickel, chrome, titanium, tantalum, tungsten, or indium, or an alloy of these metals. In particular, such metal microparticles are preferably made of silver or copper. While such metal microparticles are not limited to any specific size or shape, microparticles with a diameter of several nanometers to several tens of nanometers are preferably used. These features allow a reduction in firing temperature of the ink composition. These features also allow an improvement in dispersibility of the metal microparticles and/or an improvement in fluidity of the ink composition, thereby stabling an ejection operation.

As the dispersion medium, water or a water solution having water as the main ingredient may be used. Such a dispersion medium may include a water-soluble organic solvent as necessary in order to adjust the viscosity of the ink composition. Such water-soluble organic solvents include alkyl alcohols such as ethanol, methanol, butanol, propanol, and isopropanol, glycols such as ethylene glycol, propylene glycol, diethylene glycol, and triethylene glycol, and glycol ethers such as ethylene glycol monomethyl ether, ethylene glycol monoethyl ether, ethylene glycol monobutyl ether, ethylene glycol monomethyl ether acetate, propylene glycol monomethyl ether, and propylene glycol monoethyl ether. Such a water-soluble organic solvent may also be a mixture of these substances.

The dispersant easily dissolves in water and coordinates the metal microparticles so as to stabilize the colloid state of the metal microparticles. Such a dispersant may be hydroxyl acid or hydroxyl acid chloride having a carboxyl group and a hydroxyl group as functional groups. Such a hydroxyl acid may be citric acid, malic acid, tartaric acid, or a mixture of these substances. Such a hydroxyl acid chloride may be sodium citrate, potassium citrate, lithium citrate, malic acid sodium, sodium tartrate, or a mixture of these substances.

The dispersant may also be mercapto acid or mercapto acid chloride having a carboxyl group and a mercapto group as functional groups. Such mercapto acid may be mercaptoacetic acid, mercaptopropionic acid, mercapto butanoic acid, mercapto succinic acid, or a mixture of these substances. Such mercapto acid chloride may be mercapto sodium acetate, mercapto sodium propionate, mercapto sodium succinate, or a mixture of these substances.

The polyhydric alcohol may be an alcohol that is trivalent to hexavalent and solid under normal conditions (at a temperature of 25° C. and a pressure of one atmosphere). Such a polyhydric alcohol may also be a sugar alcohol obtained by reducing a carboxyl group of monosaccharide, disaccharide, oligosaccharide, and polysaccharide, 2-(hydroxymethyl)-1,3-propanediol, 1,2,3-hexanetriol, or 1,2,3-heptanetriol. Such a sugar alcohol may be, for example, pentaerythritol, dipentaerythritol, tripentaerythritol, sorbitol, erythritol, threitol, ribitol, arabinitol, xylitol, allitol, mannitol, dorcitol, iditol, glycol, inositol, maltitol, lactitol, or a mixture of these substances.

The concentration of the polyhydric alcohol is 5 to 20 weight %, preferably, 10 weight % or more relative to the total weight of the ink composition. If the concentration becomes lower than 5 weight %, the moisture retention effect the polyhydric alcohol has is reduced, thereby making inadequate the prevention of drying in the nozzle. On the other hand, if the concentration is higher than 20 weight %, the dispersion of metal microparticles is made unstable.

According to these features, the polyhydric alcohol and water interact with each other (e.g., hydrogen bonding or van der Waals bonding) in the nozzles, thereby preventing evaporation of the dispersion medium. Also, the polyhydric alcohol and the metal microparticles interact with each other (e.g., coordinate bond) in the nozzles, thereby causing the metal microparticles once deposited to disperse (re-disperse) into the ink composition again. As a result, clogging of the nozzles is prevented more reliably.

Further, when the dispersion medium evaporates on the target, the polyhydric alcohol is successively deposited. As a result, flowing out of the ink composition is avoided in proportion to the extent to which the polyhydric alcohol is solidified. Also, the re-dispersion of the metal microparticles makes the drying states of the ink composition more uniform. This prevents occurrence of a crack in the pattern due to the difference between the drying states.

Pattern Forming Method

A pattern forming method according to the invention will now be described with reference to FIGS. 1 and 2. First, a droplet ejection device will be described.

In FIG. 1, a droplet ejection device 1 includes a substrate stage 3 that travels linearly along the length direction (Y arrow direction) of a base 2. The substrate stage 3 is a stage for placing a green sheet 4 serving as a target. It carries the green sheet 4 placed thereon in the Y direction and the reverse Y direction. The green sheet 4 is a sheet substrate made of a glass ceramic material (e.g., a compound with a glass content such as borosilicic acid alkali oxide and a ceramics content such as alumina). It is formed in the thickness of several hundred μm.

The substrate stage 3 heats and maintains the green sheet 4 placed thereon to a predetermined temperature. The predetermined temperature is set up to a temperature that is lower than the boiling point of a liquid composition having the lowest boiling point among the compositions included in the ink composition. This avoids bumping of the ink composition when the ink composition lands on the green sheet 4, as well as facilitates drying of the ink composition.

A gate-shaped guide member 5 is built so as to straddle the base 2 in a direction (X arrow direction) perpendicular to the Y direction. Disposed on the guide member 5 is an ink tank 6. The ink tank 6 stores the ink composition (metal ink IM) and supplies the metal ink IM to a droplet ejection head 8. Disposed below the guide member is a carriage 7 that reciprocates in the X arrow direction and in the reverse X arrow direction. The carriage 7 includes the droplet ejection head 8. Multiple ejection nozzles N are formed on the droplet ejection head 8 so as to be arranged along the X arrow direction.

Figure 2:
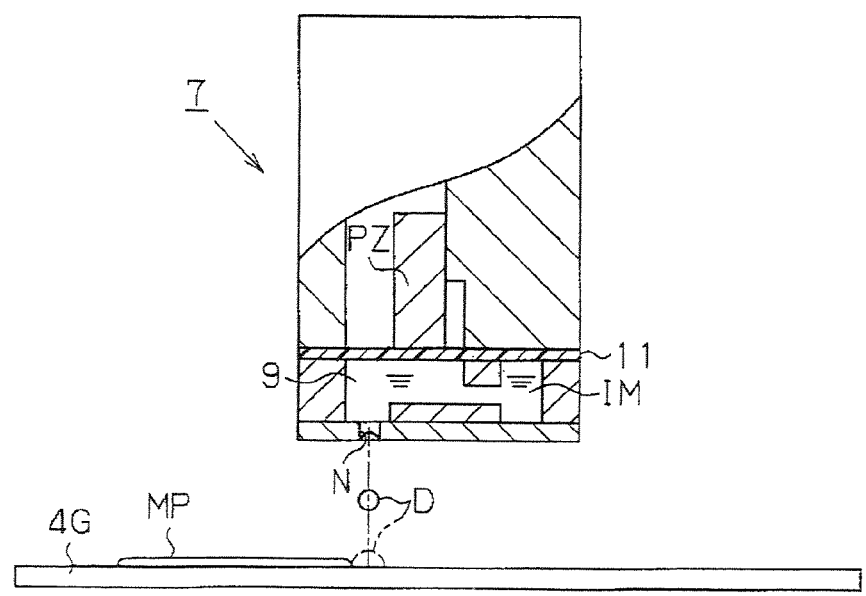
FIG. 2 is a sectional view of the main part of a droplet ejection head.

In FIG. 2, a cavity 9 is formed on the upper side of each of the ejection nozzles N so as to communicate with the ink tank 6. The cavity 9 stores the metal ink IM from the ink tank 6 and supplies it to the corresponding ejection nozzle N. A diaphragm 11 is disposed on the upper side of the cavity 9 so as to vibrate in the vertical direction to expand and shrink the volume of the cavity 9. A piezoelectric element PZ is disposed on the upper side of the diaphragm 11 so as to correspond to the ejection nozzle N. The piezoelectric element PZ shrinks and expands in the vertical direction to vibrate the diaphragm 11 in the vertical direction.

When the green sheet 4 placed on the substrate stage 3 is carried in the Y arrow direction to pass immediately below the ejection nozzle N, the piezoelectric element PZ expands and shrinks in the vertical direction so as to make the metal ink IM stored in the corresponding cavity 9 into droplets D of a predetermined size and to eject these droplets from the corresponding ejection nozzle N. The ejected droplets D land on the green sheet 4 positioned immediately below the ejection nozzle N. Since the green sheet is previously heated on the substrate stage 3, the droplets D that have landed on the green sheet 4 go dry to form the metal pattern MP while rapidly evaporating the dispersion medium included therein.

At that time, since the polyhydric alcohol is solid under normal conditions, it is deposited as the dispersion medium evaporates. This prevents the excessive spread (flowing out) of the droplets D that are in the process of drying but still in a wet state, in proportion to the extent to which the polyhydric alcohol is deposited. Thus, the metal ink IM avoids causing a short circuit between the adjacent metal patterns MP.

Further, the polyhydric alcohol included in the metal ink IM prevents abrupt evaporation of the water included in the metal ink IM. Thus, the metal ink IM prevents formation of a crack in the patterns that are in the process of drying.

On the other hand, in each ejection nozzle N, the stored gas-liquid interface (meniscus) remains stationary when the corresponding piezoelectric element PZ is not expanding or shrinking. At that time, the concentration and moisture-retention force of the polyhydric alcohol included in the metal ink IM prevents evaporation of the water included in the metal ink IM. Thus, the metal ink IM prevents itself from going dry in each ejection nozzle N, as well as facilitates the re-dispersion of the metal microparticles once dried, thereby stabilizing the ejection state of each ejection nozzle.

First Working Example

Silver microparticles with a diameter of 30 nm were prepared as the metal microparticles using trisodium citrate as the dispersant and adjusted using pure water as the dispersion medium so that the concentration of the silver microparticles is 40 weight % relative to the total weight of the metal ink.

Xylitol was used as the polyhydric alcohol and adjusted so that the concentration of the xylitol is 1, 5, 10, 20, and 25 weight % separately. Thus, ink compositions according to a first working example were obtained.

Second to Nine Working Examples

The xylitol used in the first working example was replaced with polyhydric alcohols shown in Table 1 (erythritol, threitol, arabitol, mannitol, sorbitol, 2-(hydroxymethyl)-1,3-propanediol, 1,2,3-hexanetriol, and 1,2,3-heptanetriol) to obtain ink compositions according to second to nine working examples.

First to Thirteenth Comparative Examples

The xylitol used in the first working example was replaced with alcohols shown in Table 1 (ethylene glycol, 1,3-propanediol, glycerin, 1,2,4-butanetriol, 1,5-pentanediol, 1,2-pentanediol, 2,4-pentanediol, 1,2-hexanediol, 1,6-hexanediol, 2,5-hexanediol, 2-methyl-2, 4-pentanediol, 3-methyl-1,3,5-pentanetriol, 1,2,6-hexanetriol) to obtain ink compositions according to first to thirteenth comparative examples.

Ejection Stability

The ink compositions according to the first to ninth working examples and those according to the first to thirteenth comparative examples were loaded into the droplet ejection device 1 separately. Using the green sheet 4 as the target, only 100 droplets D each having a weight of 10 ng were ejected from each ejection nozzle N at the ejection frequency of 1 kHz per minute. Then, the presence/non-presence of flight bending of the droplets D and the presence/non-presence of clogging (non-ejection of the droplets D) of the nozzles was checked. The evaluation result of the ejection stability is shown in Table 1.

TABLE 1

| | | Alcohol valence | Carbon number | Typical state | Concentration (weight %) | | | | |
|---|---|---|---|---|---|---|---|---|---|
| | | | | | 1 | 5 | 10 | 20 | 25 |
| Working example 1 | Xylitol | 5 | 5 | Solid | C | B | A | A | A |
| Working example 2 | Erythritol | 4 | 4 | Solid | C | B | A | A | A |
| Working example 3 | Threitol | 4 | 4 | Solid | C | B | A | A | A |
| Working example 4 | Arabitol | 5 | 5 | Solid | C | B | A | A | A |
| Working example 5 | Mannitol | 6 | 6 | Solid | C | B | A | A | A |
| Working example 6 | Sorbitol | 6 | 6 | Solid | C | B | A | A | A |
| Working example 7 | 2-(Hydroxymethyl)-1,3-Propanediol | 3 | 4 | Solid | C | B | A | A | A |
| Working example 8 | 1,2,3-Hexanetriol | 3 | 6 | Solid | C | B | A | A | A |
| Working example 9 | 1,2,3-Heptanetriol | 3 | 7 | Solid | C | B | A | A | A |
| Comparative example 1 | Ethylene Glycol | 2 | 2 | Liquid | C | C | C | C | C |
| Comparative example 2 | 1,3-Propanediol | 2 | 3 | Liquid | C | C | C | C | C |
| Comparative example 3 | Glycerin | 3 | 3 | Liquid | C | B | A | A | A |
| Comparative example 4 | 1,2,4-Butanetriol | 3 | 4 | Liquid | C | B | A | A | A |
| Comparative example 5 | 1,5-Pentanediol | 2 | 5 | Liquid | C | C | B | A | A |
| Comparative example 6 | 1,2-Pentanediol | 2 | 5 | Liquid | C | C | B | A | A |

TABLE 1-continued

|  |  | Alcohol valence | Carbon number | Typical state | Concentration (weight %) | | | | |
|---|---|---|---|---|---|---|---|---|---|
|  |  |  |  |  | 1 | 5 | 10 | 20 | 25 |
| Comparative example 7 | 2,4-Pentanediol | 2 | 5 | Liquid | C | C | B | A | A |
| Comparative example 8 | 1,2-Hexanediol | 2 | 6 | Liquid | C | B | A | A | A |
| Comparative example 9 | 1,6-Hexanediol | 2 | 6 | Liquid | C | C | B | A | A |
| Comparative example 10 | 2,5-Hexanediol | 2 | 6 | Liquid | C | C | B | A | A |
| Comparative example 11 | 2-Methyl-2, 4-Pentanediol | 2 | 6 | Liquid | C | C | B | A | A |
| Comparative example 12 | 3-Methyl-1, 3,5-Pentanetriol | 3 | 6 | Liquid | C | B | A | A | A |
| Comparative example 13 | 1,2,6-Hexanetriol | 3 | 6 | Liquid | C | B | A | A | A |

In Table 1, "A" indicates that none of flight bending of any droplet D and non-ejection of any droplet D has been identified continuously for seven days or more after the start of the ejection operation. "B" indicates that flight bending of any droplet D or non-ejection of any droplet D has been identified in the period between the second day and sixth day inclusive after the start of the ejection operation. "C" indicates that flight bending of any droplet D or non-ejection of any droplet D has been identified in less than one day after the start of the ejection operation.

From Table 1, it is understood that among the ink compositions according to the first to ninth working examples, those including polyhydric alcohol whose concentration is 5 weight % or more are able to avoid flight bending of the droplets D and non-ejection thereof for one day or more. It also is understood that among the ink compositions according to the first to ninth working examples, those including polyhydric alcohol whose concentration is 10 weight % or more are able to improve the ejection stability.

It is further understood that among the ink compositions according to the third, fourth, eighth, twelfth, and thirteenth comparative examples, those including polyhydric alcohol whose concentration is 5 weight % or more are able to avoid flight bending of the droplets D or the like for one day or more. It is further understood that among the ink compositions according to the third, fourth, eighth, twelfth, and thirteenth comparative examples, those including polyhydric alcohol whose concentration is 10 weight % or more are able to avoid flight bending of the droplets D or the like for seven days or more. In other words, it is understood that the ink compositions according to the third, fourth, eighth, twelfth, and thirteenth comparative examples are able to have approximately the same level of ejection stability as that of those according to the first to ninth working examples.

On the other hand, it is understood that among the ink compositions according to the fifth, sixth, seventh, ninth, tenth, and eleventh comparative examples, those having approximately the same level of ejection stability as that of those according to the first to ninth working examples are those having a polyhydric alcohol concentration higher than that of those according to the first to ninth working examples. It is also understood that with regard to the ink compositions according to the first and second comparative examples, even those having a polyhydric alcohol concentration of as high as 25 weight % are unable to have sufficient ejection stability.

Therefore, the trivalent to hexavalent alcohols included in the ink compositions according to the first to ninth working examples and those according to the third, fourth, twelfth, and thirteenth comparative examples more effectively prevent evaporation of the pure water included in these ink compositions, by interacting with water (e.g., hydrogen bonding or van der Waals bonding.). Also, the trivalent or higher alcohols included in the ink compositions according to the first to ninth working examples and those according to the third, fourth, twelfth, and thirteenth comparative examples facilitate the re-dispersion of the metal microparticles once deposited, by interacting with the metal microparticles (e.g., coordinate bond).

Landing Stability

The ink compositions according to the first to ninth working examples and those according to the first to thirteenth comparative examples were loaded into the droplet ejection device 1 separately. The green sheet 4 was used as the target, and the green sheet 4 was heated and maintained to 50° C. The droplets D each having a weight of 10 ng were successively ejected from the ejection nozzles N so as to draw 101 lines (metal wiring) each having a width of 70 μm and a length of 1.0 cm at pitches of 70 μm. Then, the presence/non-presence of a short circuit between the lines was checked. The evaluation result of the landing stability is shown in Table 2.

TABLE 2

|  |  | Alcohol valence | Carbon number | Typical state | Concentration (weight %) | | | | |
|---|---|---|---|---|---|---|---|---|---|
|  |  |  |  |  | 1 | 5 | 10 | 20 | 25 |
| Working example 1 | Xylitol | 5 | 5 | Solid | A | A | A | A | A |
| Working example 2 | Erythritol | 4 | 4 | Solid | A | A | A | A | A |
| Working example 3 | Threitol | 4 | 4 | Solid | A | A | A | A | A |
| Working example 4 | Arabitol | 5 | 5 | Solid | A | A | A | A | A |
| Working example 5 | Mannitol | 6 | 6 | Solid | A | A | A | A | A |
| Working example 6 | Sorbitol | 6 | 6 | Solid | A | A | A | A | A |
| Working example 7 | 2-(Hydroxymethyl)-1, 3-Propanediol | 3 | 4 | Solid | A | A | A | A | A |
| Working example 8 | 1,2,3-Hexanetriol | 3 | 6 | Solid | A | A | A | A | A |
| Working example 9 | 1,2,3-Heptanetriol | 3 | 7 | Solid | A | A | A | A | A |
| Comparative example 1 | Ethylene Glycol | 2 | 2 | Liquid | A | A | A | B | C |
| Comparative example 2 | 1,3-Propanediol | 2 | 3 | Liquid | A | A | A | B | C |
| Comparative example 3 | Glycerin | 3 | 3 | Liquid | A | A | B | B | C |
| Comparative example 4 | 1,2,4-Butanetriol | 3 | 4 | Liquid | A | A | B | B | C |

TABLE 2-continued

| | | Alcohol valence | Carbon number | Typical state | Concentration (weight %) | | | | |
|---|---|---|---|---|---|---|---|---|---|
| | | | | | 1 | 5 | 10 | 20 | 25 |
| Comparative example 5 | 1,5-Pentanediol | 2 | 5 | Liquid | A | A | B | B | C |
| Comparative example 6 | 1,2-Pentanediol | 2 | 5 | Liquid | A | A | B | B | C |
| Comparative example 7 | 2,4-Pentanediol | 2 | 5 | Liquid | A | B | B | B | C |
| Comparative example 8 | 1,2-Hexanediol | 2 | 6 | Liquid | A | A | B | B | C |
| Comparative example 9 | 1,6-Hexanediol | 2 | 6 | Liquid | A | A | B | B | C |
| Comparative example 10 | 2,5-Hexanediol | 2 | 6 | Liquid | A | A | A | B | C |
| Comparative example 11 | 2-Methyl-2, 4-Pentanediol | 2 | 6 | Liquid | A | A | B | B | C |
| Comparative example 12 | 3-Methyl-1, 3,5-Pentanetriol | 3 | 6 | Liquid | A | A | A | A | C |
| Comparative example 13 | 1,2,6-Hexanetriol | 3 | 6 | Liquid | A | A | B | B | C |

In FIG. 2, "A" indicates that a short circuit has been identified at none of the 100 intervals between these lines. "B" indicates that a short circuit has been identified at one to four intervals between these lines. "C" indicates that a short circuit has been identified at five or more intervals between these lines.

From FIG. 2, it is understood that the ink compositions according to the first to ninth working examples are able to completely avoid causing a short circuit between the lines, regardless of which concentration (1 to 25 weight %) the polyhydric alcohol included therein has. On the other hand, it is understood that among the ink compositions according to the first to thirteenth comparative examples, those including polyhydric alcohol having a concentration of 25 weight % have caused a short circuit at five or more intervals between the lines.

Therefore, the polyhydric alcohols included in the ink compositions according to the first to ninth working examples are rapidly deposited as the pure water evaporates because these polyhydric alcohols are solid under normal conditions, thereby avoiding the ink compositions from flowing out. On the other hand, the polyhydric alcohols included in the ink compositions according to the first to thirteenth comparative examples induce flowing out of the ink compositions in proportion to the fluidity of these alcohols because these alcohols are liquid under normal conditions.

It was also checked whether or not there is a crack in the lines according to the first to ninth working examples. As a result, it was understood that there was no crack in all the lines. Thus, the polyhydric alcohols according to the first to ninth working examples facilitate the re-dispersion of the metal microparticles to make the drying states of the ink compositions more uniform.

Additionally, using mercaptopropionic acid as the dispersant, ink compositions having otherwise similar configurations to those of the first to ninth working examples and the first to thirteenth comparative examples were prepared. Then the above-mentioned ejection stability and landing stability checks were performed on these ink compositions. Similar evaluation results to those shown in FIGS. 1 and 2 were obtained even from these ink compositions using mercaptopropionic acid as the dispersant.

Advantages of the embodiment configured as described above will be described below.

(1) According to the above-mentioned embodiment, the ink composition includes metal microparticles, a dispersion medium having water as the main ingredient, a dispersant for dispersing the metal microparticles into the dispersion medium, and a water-soluble polyhydric alcohol. The polyhydric alcohol is an alcohol that is trivalent to hexavalent and solid under normal conditions and whose concentration is 5 to 20 weight % relative to the total weight of the ink composition.

As a result, the 5 to 20 weight % polyhydric alcohol prevents evaporation of the pure water included in the ink composition, as well as facilitates the re-dispersion of the metal microparticles. Also, the polyhydric alcohol is rapidly deposited as the dispersion medium evaporates because the polyhydric alcohol is solid under normal conditions, thereby avoiding the droplets flowing out.

(2) According to the above-mentioned embodiment, before ejecting the droplets D of the metal ink IM to form the metal pattern MP, the metal ink IM was prepared so as to include a water-soluble polyhydric alcohol that is trivalent to hexavalent and solid under normal conditions and whose concentration is 5 to 20 weight % relative to the total weight of the metal ink IM.

As a result, the polyhydric alcohol included in the metal ink IM prevents evaporation of the pure water included in the metal ink IM, thereby facilitating the re-dispersion of the metal microparticles. Further, since the polyhydric alcohol is solid under normal conditions, it is rapidly deposited as the dispersion medium evaporates, thereby avoiding the droplets D from flowing out.

(3) According to the above-mentioned embodiment, the green sheet 4 is previously heated to a predetermined temperature and then the droplets D of the metal ink IM are ejected toward the heated green sheet 4. As a result, drying of the droplets D is further facilitated in proportion to the extent to which the green sheet 4 is heated, thereby avoiding flowing out of the droplets D more reliably.

The following modifications may be made to the above-mentioned embodiment.

The green sheet 4 is used as the target in the above-mentioned embodiment; however, without being limited to this, a glass substrate or a flexible substrate may be used. Any substrate on which a pattern made of droplets is to be formed may be used as the target.

In the above-mentioned embodiment, the droplet ejection head 8 adopts a piezoelectric element drive system. However, without being limited to this, the droplet ejection head 8 may adopt a resistance heating system or an electrostatic drive system.

The entire disclosure of Japanese Patent Application No. 2006-303657, filed Nov. 9, 2006 is expressly incorporated by reference herein.

What is claimed is:

1. A pattern forming method comprising:
   forming a metal pattern by ejecting a droplet of an ink composition from an ejection nozzle toward a target, wherein
   the ink composition comprising;

a metal microparticle;
a dispersion medium having water as a main ingredient;
a dispersant for dispersing the a metal microparticle into the dispersion medium; and
a water-soluble polyhydric alcohol that is trivalent to hexavalent and solid under conditions of 25° C. and 1 atm, and whose concentration is 5 to 20 weight % relative to a total weight of the ink composition.

2. The pattern forming method according to claim 1, wherein
the target is previously heated up to a predetermined temperature before the droplet is ejected.

* * * * *